US006973611B2

(12) United States Patent
Dabak et al.

(10) Patent No.: US 6,973,611 B2
(45) Date of Patent: Dec. 6, 2005

(54) INTERLEAVED CODER AND METHOD

(75) Inventors: Anand Dabak, Richardson, TX (US);
Eko Onggosanusi, Dallas, TX (US)

(73) Assignee: Texas Instruments Incorporated,
Dallas, TX (US)

( * ) Notice: Subject to any disclaimer, the term of this patent is extended or adjusted under 35 U.S.C. 154(b) by 518 days.

(21) Appl. No.: 10/124,769

(22) Filed: Apr. 17, 2002

(65) Prior Publication Data
US 2002/0149496 A1 Oct. 17, 2002

Related U.S. Application Data

(60) Provisional application No. 60/284,429, filed on Apr. 17, 2001, provisional application No. 60/284,656, filed on Apr. 17, 2001.

(51) Int. Cl.[7] ........................ H03M 13/29; H03M 13/45
(52) U.S. Cl. ........................ 714/755; 714/780
(58) Field of Search ................ 714/751, 755, 714/780, 790, 792

(56) References Cited

U.S. PATENT DOCUMENTS 5,559,561 A * 9/1996 Wei ........................ 348/470
6,031,874 A * 2/2000 Chennakeshu et al. ..... 375/262
6,188,717 B1 * 2/2001 Kaiser et al. ............... 375/148
6,308,294 B1 * 10/2001 Ghosh et al. ............... 714/751
6,392,572 B1 * 5/2002 Shiu et al. .................... 341/81

OTHER PUBLICATIONS

Barbulescu et al., "Terminating the Trellis of Turbo-Codes in the Same State", Electronics Letters, Jan. 5, 1995, vol. 31, No. 1, pp. 22-23.*
Robertson et al., "Extensions of Turbo Trellis Coded Modulation to High Bandwidth Efficiencies", IEEE ICC '97, Jun. 8-12, 1997, vol. 3, pp. 1251-1255.*
Rowitch et al., "On the Performance of Hybrid FEC/ARQ Systems Using Rate Compatible Punctured Turbo (RCPT) Codes", IEEE Transactions on Communications, vol. 48, No. 6, Jun. 2000, pp. 948-959.*
Khalegi et al., "On Symbol-based Turbo Codes for cdma2000", IEEE WCNC 1999, Sep. 21-24, 1999, pp. 471-475.*

* cited by examiner

Primary Examiner—Stephen M. Baker
(74) Attorney, Agent, or Firm—Carlton H. Hoel; W. James Brady; Frederick J. Telecky, Jr.

(57) ABSTRACT

Turbo encoder with even-odd bit interleaving for upper and lower component convolutional encoders and symbol-level interleaving after mapping to modulation symbols plus symbol-level buffer for both ARQ and Turbo decoding.

8 Claims, 9 Drawing Sheets

Figure 1a  encoder
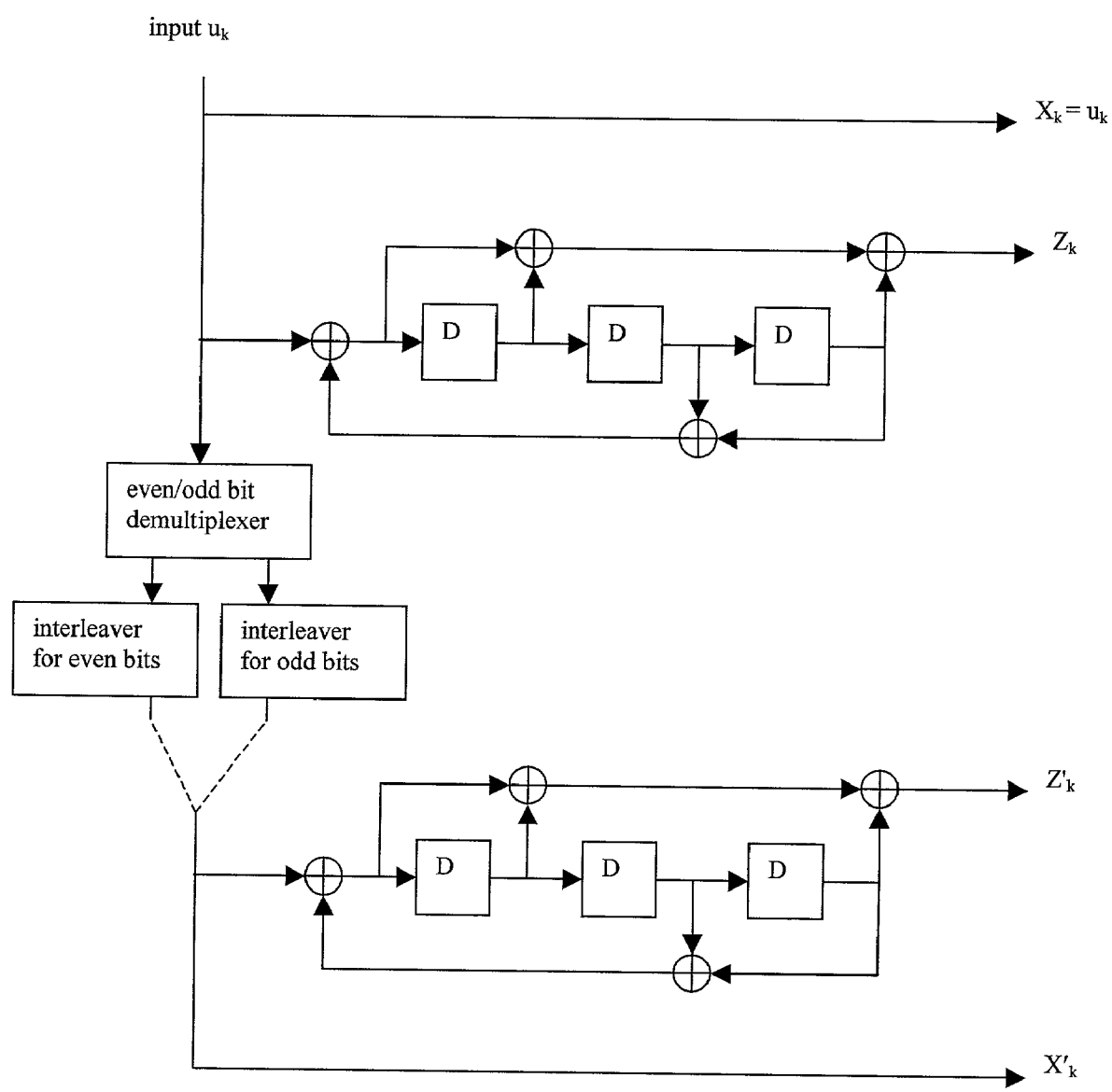

Figure 1b  encoder
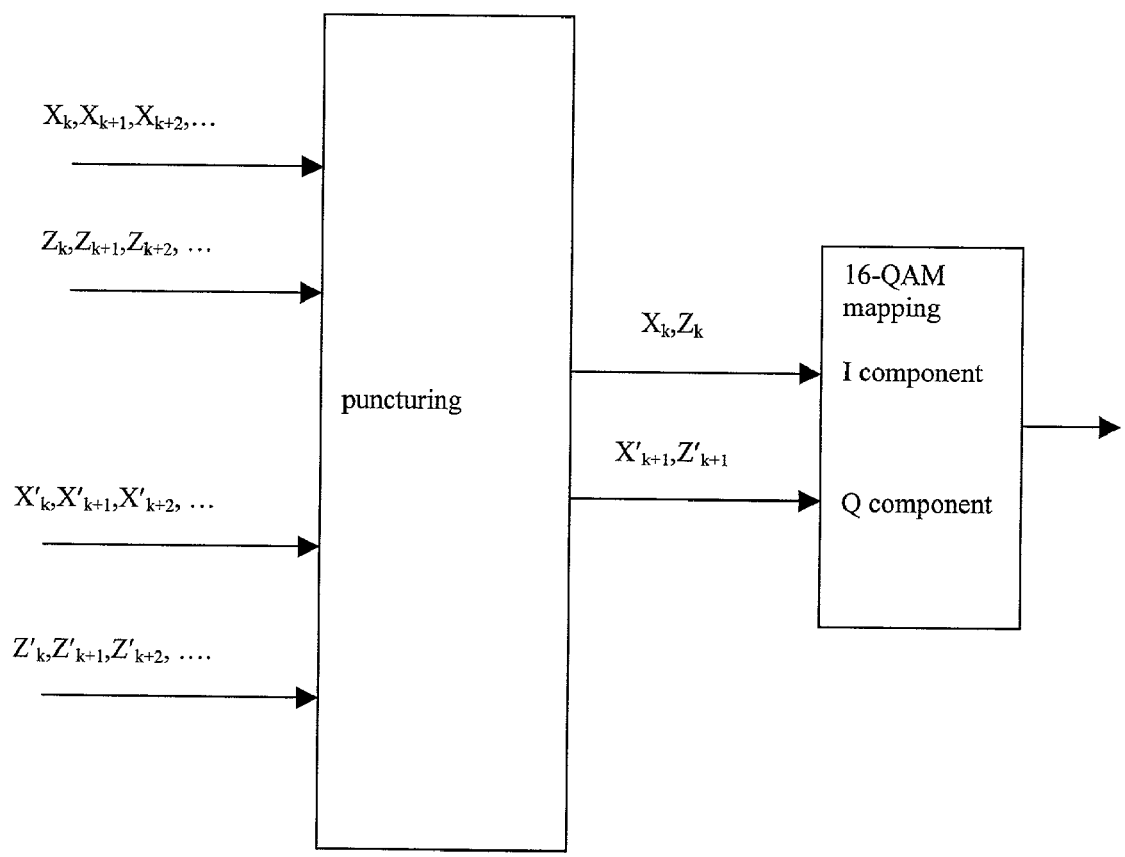

Figure 2 transmitter
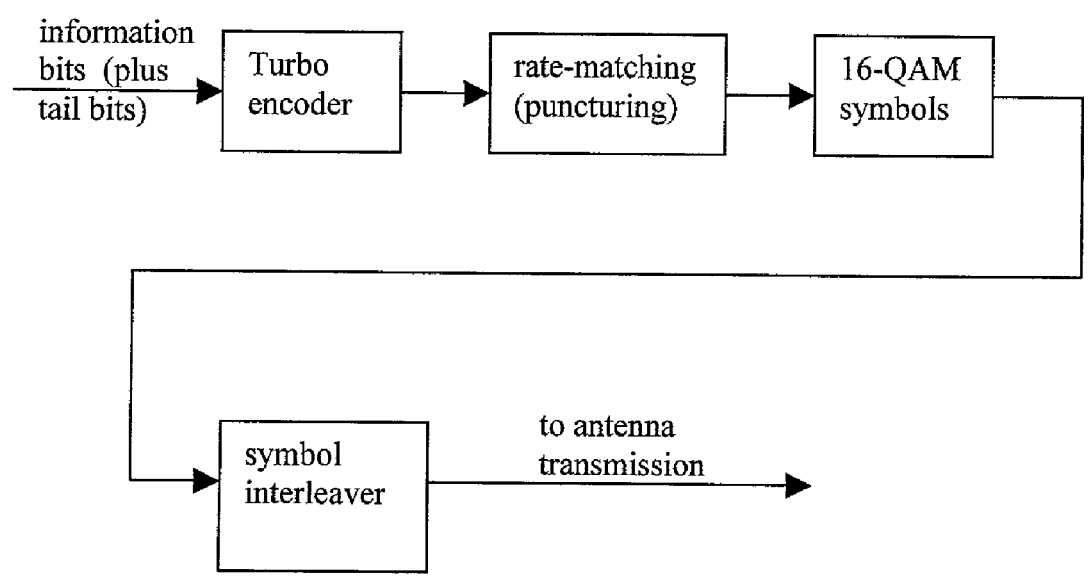

Figure 3   receiver
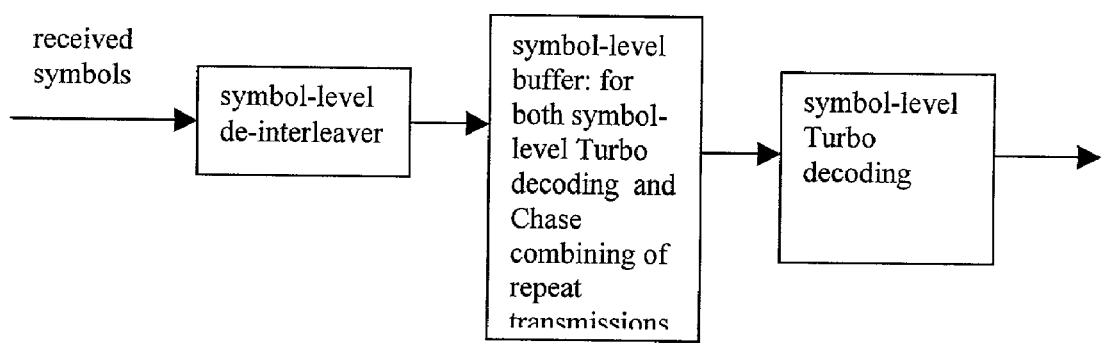

Figure 4 decoder
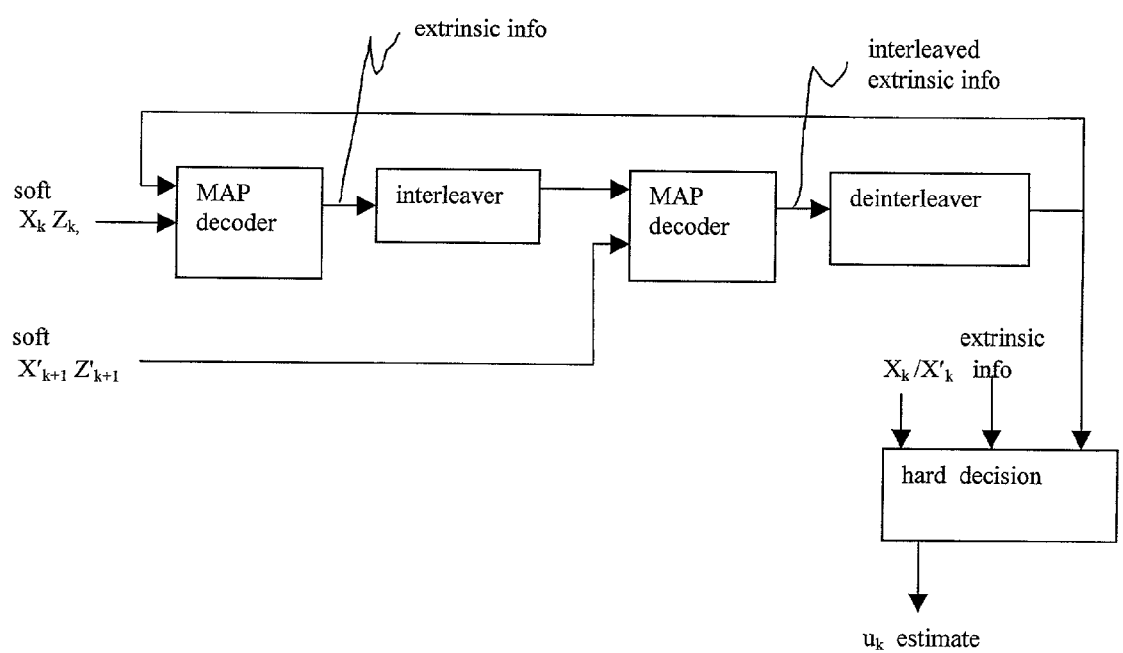

Figure 5a (prior art) encoder
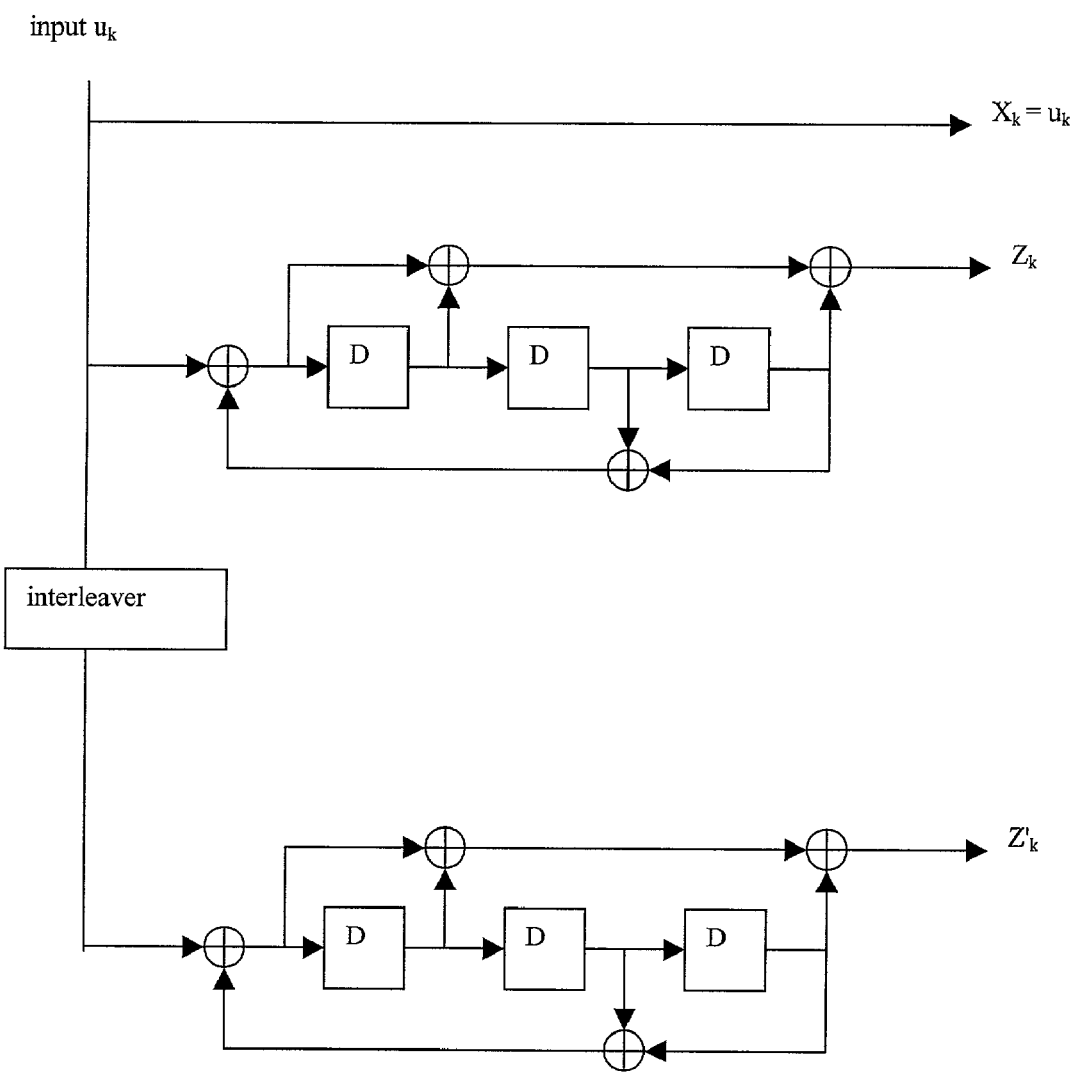

Figure 5b (prior art)   physical layer
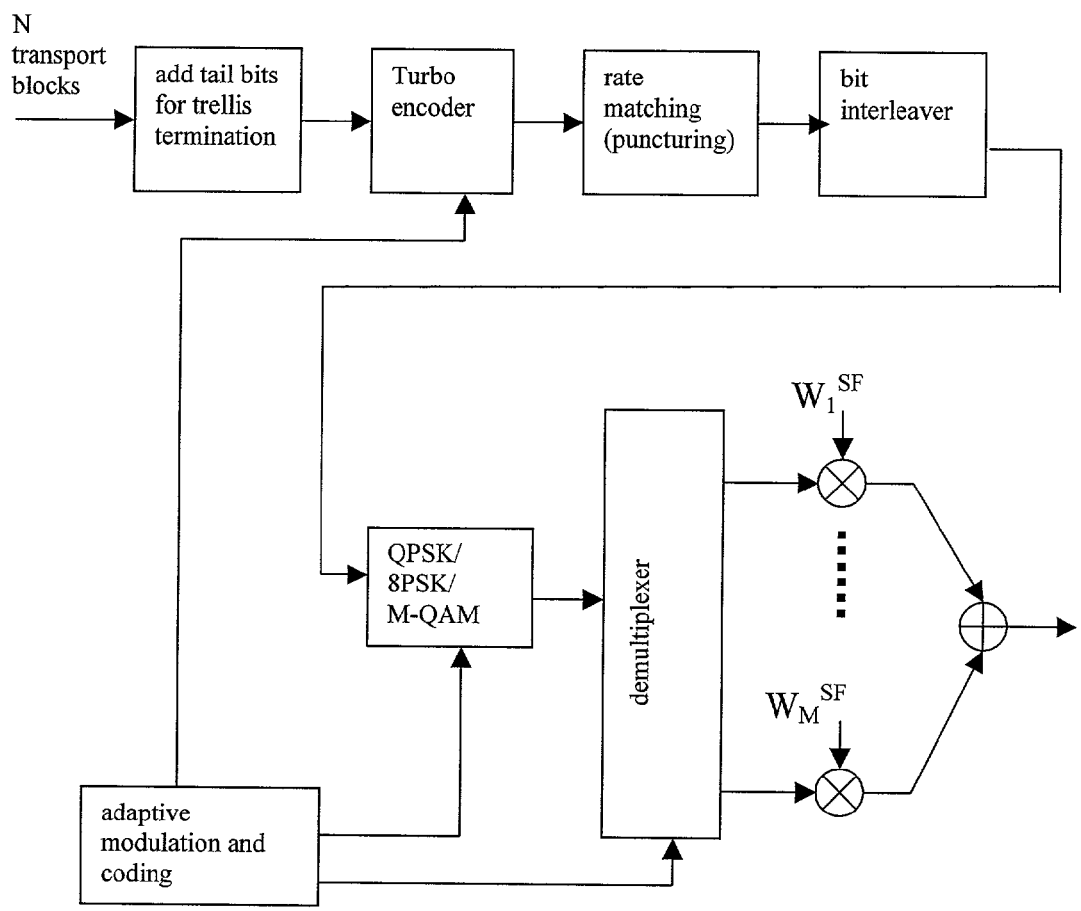

Figure 5c (prior art) receiver
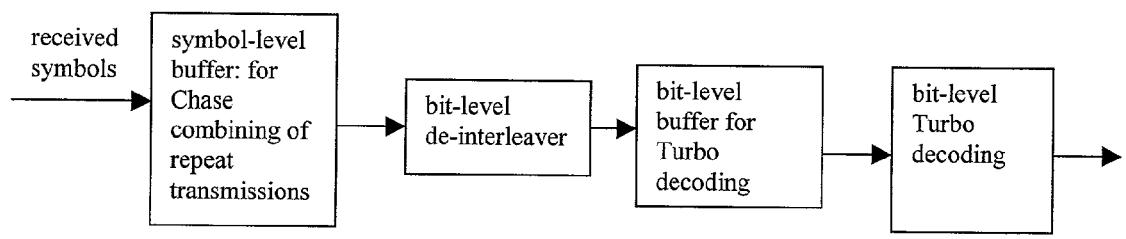

Figure 5d (prior art) decoder
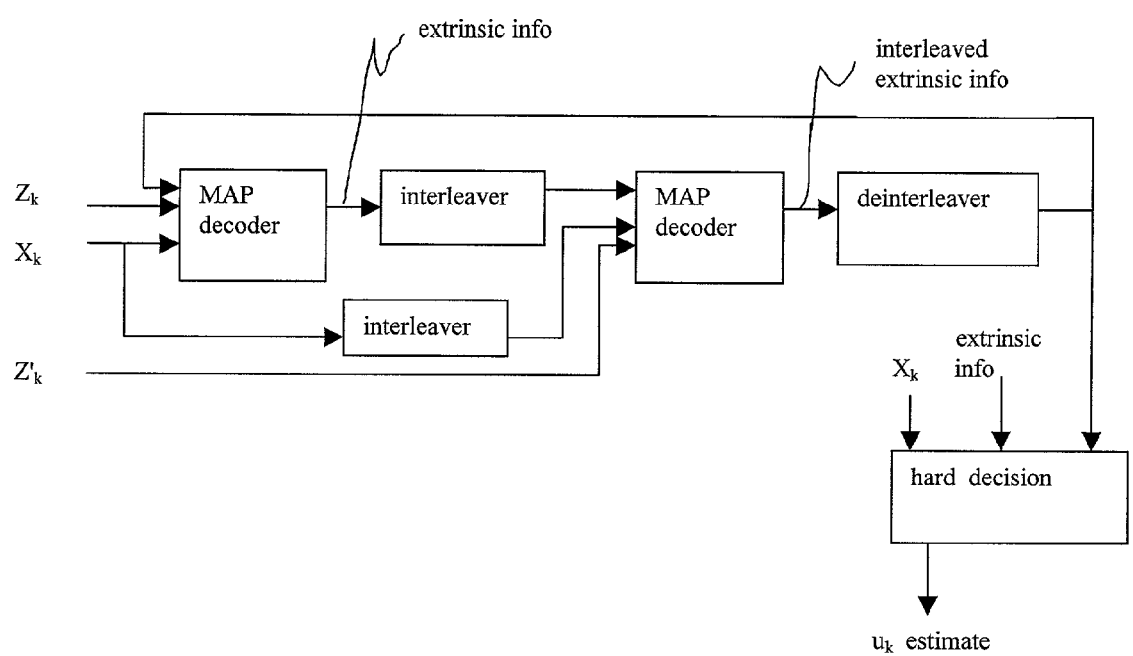

INTERLEAVED CODER AND METHOD

CROSS-REFERENCE TO RELATED APPLICATIONS

This application claims priority from the following provisional applications: Ser. Nos. 60/284,429 and 60/284,656, both filed Apr. 17, 2001. Application Ser. No. 10/033,135, filed Dec. 28, 2001, now U.S. Pat. No. 6,603,412, discloses related subject matter. These applications have a common assignee.

BACKGROUND OF THE INVENTION

1. Field of the Invention

The invention relates to channel encoding and decoding, and more particularly to interleaved codes such as Turbo codes with iterative decoding and related systems.

2. Background

Demand for wireless information services via cell phones, personal digital assistants (PDAs), and Internet appliances (IA) plus wireless networking among notebook computers is rapidly growing. However, the air interface in wireless communication typically has a large bit error rate due to effects such as noisy channels with multipath fading.

Channel coding for the air interface transmission channel using CDMA (code division multiple access) together with reception schemes such as rake detectors help mitigate the error rate. In particular, third generation wireless proposals include channel coding of data packets with rate ⅓ Turbo codes. Turbo codes are parallel concatenated convolutional codes with an interleaving between the parallel codes. FIG. 5a illustrates the wireless standard UMTS/3GPP Turbo encoder (the trellis termination connections have been omitted for clarity). The encoder operates on blocks of input data (block size in the range of 320 to 5114 bits), and the interleaver essentially randomly permutes the bits within the block. This permutation underlies the good coding performance because input bits initially close together are typically spread apart by the interleaver.

The UMTS/3GPP has a high-speed downlink packet access (HSDPA) standard including punctured Turbo codes and hybrid automatic repeat request (H-ARQ) options with Chase combining (combining retransmitted packets according to SNR). FIG. 5b illustrates the HSDPA transmitter physical layer structure. Following the Turbo encoding the rate-matching block repeats or punctures bits in the bit stream, and the interleaver is a block interleaver (read bits into a matrix row by row, permute columns, and read out bits column by column). The QPSK/8PSK/M-QAM block maps the bits in groups (⅔/$\log_2$M) to modulation constellation points, and the $W_j^{SF}$ are spreading codes. And FIG. 5c shows the receiver with ARQ implemented using Chase combining of repeated packets. The transmission time interval (the packet size for the ARQ) may be adaptively selected from a set such as 1, 3, 5, or 15 time slots with each time slot being 0.667 msec and 15 time slots forming a radio frame (10 msec). Attached CRC bits can be used for error detection in decoding and the basis for ACK (acknowledge) or NACK (negative acknowledge) messages back to the transmitter.

FIG. 5d illustrates an iterative MAP (maximum a posteriori probability) decoder consisting of repeated applications of computations based on the trellises of the two constituent convolutional codes and the interleaver of the encoder. MAP decoding is more complex than but provides better performance than Viterbi decoding. U.S. Pat. No. 6,023,783 (Divsalar) discloses various Turbo encoders and decoders, and Hagenauer et al, Iterative Decoding of Binary Block and Convolutional Codes, 42 IEEE Tr. Info. Th. 429 (1996) describes the soft iterative MAP decoding.

Further, Robertson et al, A Novel Bandwidth Efficient Coding Scheme Employing Turbo Codes, IEEE Intl. Conf. Comm. 962 (1996) and Yuan et al, Turbocoded M-QAM for fading channels, 36 Elec. Lett. 1562 (2000) describe a symbol-by-symbol Turbo encoding and decoding with the encoder de-interleaving prior to puncturing and 8PSK and 16-QAM modulation.

SUMMARY OF THE INVENTION

The present invention provides symbol-by-symbol Turbo encoding with separate even-odd interleaving between convolution coders and symbol-level interleaving subsequent to mapping to symbols. Also reverse order receiving with symbol-level de-interleaving and buffering for symbol-level Turbo decoding.

This has advantages including higher performance Turbo coding and simpler receiver buffering which provides both ARQ combining and Turbo decoding.

BRIEF DESCRIPTION OF THE DRAWINGS

The drawings are heuristic for clarity.

FIGS. 1a–1b show preferred embodiment encoders.
FIG. 2 illustrates a preferred embodiment transmitter.
FIG. 3 shows a preferred embodiment receiver.
FIG. 4 shows a decoder.
FIGS. 5a–5d illustrate known encoder/decoder.

DETAILED DESCRIPTION OF THE PREFERRED EMBODIMENTS

1. Overview

Preferred embodiment communication systems incorporate preferred embodiment encoding and decoding methods and include Turbo encoders with the interleaver between two convolutional coders separated into even and odd interleavers for even-numbered and odd-numbered bits and the outputs of the two convolutional coders punctured to provide the I and Q inputs for a QAM modulator. Final interleaving occurs after the QAM mapping and is on a symbol level; this allows a receiver with symbol-level de-interleaving plus a single buffer for both ARQ repeats (e.g., stop-and-wait (SAW) with Chase combining) and inputs for a symbol-by-symbol Turbo decoder. A symbol is understood to represent at least two bits.

Preferred embodiment systems and methods include cellular CDMA wireless with hybrid ARQ and various modulations (e.g., QAM, 8PSK, QPSK, . . . ) and using a preferred embodiment Turbo encoding.

Preferred embodiment wireless communications systems components, base stations and mobile users, could each include one or more application specific integrated circuits (ASICs), (programmable) digital signal processors (DSP's), and/or other programmable devices with stored programs for control of the preferred embodiment interleavers and MAP decoders. The base stations and mobile users may also contain analog integrated circuits for amplification of inputs to or outputs from antennas and conversion between analog and digital; and these analog and processor circuits may be integrated on a single die. The stored programs may, for example, be in external or onboard ROM, flash EEPROM, and/or FeRAM. The antennas may be parts of RAKE detectors with multiple fingers for each user's signals. The DSP core could be a TMS320C6xxx or TMS320C5xxx from Texas Instruments.

2. 16-QAM Preferred Embodiment Encoder

FIGS. 1a–1b illustrate a first preferred embodiment Turbo encoder (trellis-termination connection and tail bits are omitted) with the interleaver between the two convolution coders decomposed into even and odd interleavers so that bits with even-numbered indices ($u_k$ with k even) from a block of bits are interleaved by the even interleaver and bits with odd-numbered indices ($u_{k+1}$ with k odd) form a block interleaved by the odd interleaver. For 3GPP applications the block size falls in the range of 320 to 5114 bits, so the even interleaver and the odd interleaver each operates on blocks with sizes in the range of 160 to 2557 bits. For a block of bits of size N, the even interleaver applies index permutation $\pi_{even}$ which is a permutation of the integers 0, 2, 4, ... N–2 and the odd interleaver applies index permutation $\pi_{odd}$ which is a permutation of the integers 1, 3, 5, ... N–1. That is, input block of bits $u_0, u_1, u_2, u_3, \ldots, u_{N-1}$ yields output block of bits $U_{\pi even(0)}, U_{\pi odd(1)}, U_{\pi even(2)}, u_{\pi odd(3)}, \ldots u_{\pi odd(N-1)}$. Each interleaver may perform its permutation, for example, by using a lookup table for memory address permutation or, as a further example, by writing the even (odd) bits into a memory array row by row, permuting the columns, permuting the bits within each row, and reading the bits out column by column.

For simplicity (and possible use by both interleavers of the same circuitry for a hardwired or address lookup table), the two interleavers may perform essentially the same permutation; that is, the two permutations may be such that $\pi_{even}(2n)+1 = \pi_{even}(2n+1)$.

Each of the two constituent convolution coders in FIG. 1a outputs a sequence of systematic and parity bits: the upper coder outputs . . . , $X_k, Z_k, X_{k+1}, Z_{k+1}, X_{k+2}, Z_{k+2}, X_{k+3}, Z_{k+3}, \ldots$ where $X_k=u_k$, and similarly the lower coder outputs . . . , $X'_k, Z'_k, X'_{k+1}, Z'_{k+1}, X'_{k+2}, Z'_{k+2}, X'_{k+3}, Z'_{k+3}, \ldots$ where $X'_k=u_{\pi(k)}$ with $\pi(k)=\pi_{even}(k)$ for k even and $\pi(k)=\pi_{odd}(k)$ for k odd.

After convolutional encoding, the puncturing block alternates between discarding a systematic bit plus associated parity bit from the upper convolutional coder and a systematic bit plus associated parity bit from the lower convolutional coder to output the sequence . . . , $X_k, Z_k, X'_{k+1}, Z'_{k+1}, X_{k+2}, Z_{k+2}, X'_{k+3}, Z'_{k+3}, \ldots$ The mapping to 16-QAM thus takes as the I and Q inputs for an output symbol a systematic bit plus associated parity bit from each convolutional coder. That is, for k an even integer a 16-QAM symbol would have $X_k, Z_k$ as mapping to the I component and $X'_{k+1}, Z'_{k+1}$ as mapping to the Q component. Of course, the puncturing could use the odd bits from the upper coder and the even from the lower coder.

3. Alternative Modulations

The foregoing preferred embodiments may be altered to provide other coding rates and modulations such as 16-QAM with rate ¾ Turbo coding or 64-QAM with rate ⅔ Turbo coding. In particular, for 16-QAM with rate ¾, the output sequence would have more punctures of parity bits and could be something like: . . . , $X_k, Z_k, X'_{k+1}, Z'_{k+1}, X_{k+2}, X_{k+4}, X'_{k+3}, X'_{k+5}, \ldots$ with the I component still from the uppper convolutional coder and the Q component from the lower convolutional coder. Likewise, 64-QAM uses groups of six bits, so the output sequence could be something like . . . , $X_k, Z_k, X_{k+2}, X'_{k+1}, Z'_{k+1}, X'_{k+3}\ldots$ The upper and lower convolutional coders of the Turbo coder of FIG. 1a could each be a rate ⅓ coder by outputting another parity bit. This would provide more puncturing possibilities and more rate options.

4. Preferred Embodiment Transmitter

FIG. 2 shows blocks of a preferred embodiment transmitter as including a symbol-level interleaver following the mapping of Turbo-encoded bits to 16-QAM symbols. This contrasts with the prior art (see FIG. 5c) bit-level interleaver preceding the mapping of Turbo-encoded bits to 16-QAM symbols. In particular, the symbol-level interleaver is a block interleaver which may read a sequence of symbols (e.g., . . . $I_k$-$Q_k$, $I_{k+1}$-$Q_{k+1}$, $I_{k+2}$-$Q_{k+2}$, . . . ) into a memory array row by row, permute the columns of symbols, and then read out the symbols column by column to yield a permuted sequence of symbols (e.g., $I_{\pi(k)}$-$Q_{\pi(k)}$, $I_{\pi(k+1)}$-$Q_{\pi(k+1)}$, $I_{\pi(k+2)}$-$Q_{\pi(k+2)}$,.). For example, with an initial block of about 1000 information bits (which may include forward error correction bits), the foregoing Turbo encoding with puncturing to a code rate of ½ will output a block of about 2000 code bits which will map to about 500 16-QAM symbols. Thus the symbol-level interleaver may use an array such as 25 rows by 20 columns. Alternatively, the interleaving could be writing the sequence to memory and reading out at an address permutation computed from a lookup table.

Note that for clarity FIG. 2 omits other transmitter blocks such as de-multiplexer, spreader, pulse generator, power amplifiers, and antenna(s).

The transmitter blocks of FIG. 2 could be a part of a multiple-antenna system and feed a multi-code de-multiplexer for code reuse (analogous to FIG. 5b). The de-multiplexer would feed M substreams to each of N spreading code blocks, and each spreading code block outputs one substream to each of M antennas with a pilot symbol for each antenna added to the sum of substreams for that antenna.

5. Preferred Embodiment Receiver

FIG. 3 shows a corresponding preferred embodiment receiver as including symbol-level de-interleaver followed by a single symbol-level buffer and a symbol-level Turbo decoder. The symbol-level de-interleaving simply reverses the symbol-level interleaving of the transmitter and may operate in the same manner but with the inverse index permutation.

The use of symbol-level Turbo decoding permits use of a single buffer rather than separate buffers for the ARQ (symbol level) and the Turbo decoder (bit level). (FIG. 5c shows the prior art separate buffer architecture.) For example in HSDPA with a chip rate of 3.84 Mc/s, a spreading factor of SF=32, 20 spreading codes, a SAW hybrid ARQ with 4 sub-channels (repeat period), and a transmission time interval of 3.33 msec (5 time slots), the symbol-level buffer would require 64 Ksymbols (64 KB if 1 byte per symbol) with Chase combining. In contrast, the use of both a symbol-level memory for the ARQ and a bit-level memory for the Turbo decoder would require the same 64 KB memory plus a 128 KB memory for the code bits with 16-QAM modulation due to 2 soft bits for each of I and Q components. Thus the preferred embodiment saves memory in the receiver, and this is significant for a mobile receiver operating on battery power.

FIG. 4 shows a block diagram of a symbol-level Turbo decoder with soft variables as the log(detected probability)—log(a priori probability) and symbol-level encoding implies the systematic ($X_k$) and parity ($Z_k$) information are not independent but part of the same symbol, and therefore a combination of systematic and parity information is fed between the two MAP decoders. Non-extrinsic input to the left MAP is alternating soft $X_k, Z_k$ (k even) and 0 (k odd), whereas the non-extrinsic input to the right MAP is alternating 0 (k even) and soft $X'_k, Z'_k$ (k odd).

6. Modifications

The preferred embodiments may be varied while retaining one or more of the features of symbol-level interleaving and de-interleaving plus receiver symbol-level buffering for both ARQ combining and decoding.

For example, encoding methods other than Turbo encoding could be used provided that a symbol-level decoding exists, and an ARQ combining other than Chase combining could be used although the symbol-level buffer may need to be expanded.

What is claimed is:

1. A method of encoding for transmission, comprising:
   (a) separating a block of bits into first and second subblocks;
   (b) interleaving the bits of said first subblock and interleaving the bits of said second subblock to form an interleaved block of bits;
   (c) encoding said block of bits;
   (d) encoding said interleaved block of bits;
   (e) mapping said encoded block of bits from step (c) plus said encoded interleaved block of bits from step (d) to a block of symbols, wherein said mapping uses input from said encoded block of bits plus input from said encoded interleaved block of bits to form each symbol; and
   (f) interleaving said block of symbols.

2. The method of claim 1, further comprising:
   (a) puncturing said encoded block bits from step (c) of claim 1 plus said encoded interleaved block of bits from step (d) of claim 1 prior to said mapping of step (e) of claim 1.

3. The method of claim 1, further comprising:
   (a) adding tail bits prior to encoding of step (c) of claim 1 wherein said encoding of step (c) of claim 1 includes a convolutional encoding.

4. An encoder for transmission, comprising:
   a Turbo encoder, said encoder with a first output from input bits and a second output from interleaved input bits;
   a mapper to symbols, said mapper coupled to output of said encoder and using input from both said first output and said second output to form each symbol; and
   a symbol interleaver coupled to output of said mapper.

5. A method of receiving encoded transmission, comprising:
   (a) detecting received symbols;
   (b) storing said symbols from step (a);
   (c) combining said stored symbols from step (b) with automatic repeat request transmission(s) of said symbols; and
   (d) using said combined symbols from step (c) as inputs to a symbol-level decoder.

6. The method of claim 5, wherein:
   (a) said symbol-level decoder is a symbol-level Turbo decoder; and
   (b) said symbols are 16-QAM symbols.

7. The method of claim 5, further comprising:
   (a) de-interleaving said detected symbols from step (a) of claim 5 prior to said storing said symbols in step (b) of claim 5.

8. A receiver for encoded transmission, comprising:
   (a) a symbol-level buffer;
   (b) an automatic repeat request circuit coupled to said buffer; and
   a symbol-level Turbo decoder coupled to said buffer.

* * * * *